United States Patent
Zhao et al.

(10) Patent No.: US 11,115,036 B1
(45) Date of Patent: Sep. 7, 2021

(54) RESISTOR-CAPACITOR OSCILLATOR (RCO) WITH DIGITAL CALIBRATION AND QUANTIZATON NOISE REDUCTION

(71) Applicant: QUALCOMM Incorporated, San Diego, CA (US)

(72) Inventors: Shitong Zhao, San Diego, CA (US); Kevin Jia-Nong Wang, Poway, CA (US); Shyam Sivakumar, Mountain View, CA (US); Debesh Bhatta, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/991,882

(22) Filed: Aug. 12, 2020

(51) Int. Cl.
  *H03L 7/093* (2006.01)
  *H03L 7/099* (2006.01)
  (Continued)

(52) U.S. Cl.
  CPC ............ *H03L 7/093* (2013.01); *H03L 7/0991* (2013.01); *H03L 7/0995* (2013.01); *H03L 7/148* (2013.01); *H03L 7/24* (2013.01)

(58) Field of Classification Search
  CPC ......... H03L 7/091; H03L 7/093; H03L 7/099; H03L 7/0991; H03L 7/0992; H03L 2207/50
  See application file for complete search history.

(56) References Cited

U.S. PATENT DOCUMENTS 5,836,691 A   11/1998   Yamauchi
6,115,441 A    9/2000   Douglass et al.
(Continued)

FOREIGN PATENT DOCUMENTS

EP   1995875 A1   11/2008
EP   2775626 A1    9/2014

OTHER PUBLICATIONS

Abidi A A: "Linearization of Voltage Controlled Oscillators Using Switched Capacitor Feedback", IEEE Journal of Solid State Circuits, Jan. 6, 2003 (Jan. 6, 2003), XP055320334, vol. 22, No. 3, pp. 494-496.

(Continued)

*Primary Examiner* — Diana J. Cheng
(74) *Attorney, Agent, or Firm* — Chui-kiu Teresa Wong

(57) ABSTRACT

An oscillator including a switched capacitor configured to generate a sawtooth or ramp voltage in response to a switched capacitor drive signal; a low pass filter (LPF) configured to filter the sawtooth or ramp voltage to generate a filtered voltage; a reference voltage generator configured to generate a reference voltage; an integrator configured to integrate a difference between the sawtooth or ramp voltage and the reference voltage to generate a frequency control signal; a voltage controlled oscillator (VCO) configured to generate a first clock based on the frequency control signal; a frequency divider configured to frequency divide the first clock to generate a second clock; and a switched capacitor driver configured to generate the switched capacitor drive signal in response to the second clock. The oscillator may also include a switched capacitor sampler to sample the sawtooth or ramp voltage, wherein the filtered voltage is based on the sampled voltage.

28 Claims, 6 Drawing Sheets

(51) Int. Cl.
*H03L 7/24* (2006.01)
*H03L 7/14* (2006.01)

(56) References Cited

U.S. PATENT DOCUMENTS

| | | | |
|---|---|---|---|
| 6,167,078 A * | 12/2000 | Russo | H04B 1/38 |
| | | | 375/222 |
| 6,542,105 B2 | 4/2003 | Sakuragi | |
| 6,614,313 B2 * | 9/2003 | Crofts | H03K 3/0231 |
| | | | 331/1 R |
| 7,574,185 B2 * | 8/2009 | Ko | H03L 7/1976 |
| | | | 455/255 |
| 7,592,864 B2 * | 9/2009 | Kang | H03H 11/1252 |
| | | | 327/552 |
| 7,982,550 B1 | 7/2011 | Quevy et al. | |
| 8,026,769 B2 * | 9/2011 | Kwan | H03L 7/02 |
| | | | 331/16 |
| 8,085,070 B2 * | 12/2011 | Wu | G06F 1/08 |
| | | | 327/156 |
| 8,144,047 B2 | 3/2012 | Lin et al. | |
| 8,421,663 B1 | 4/2013 | Bennett | |
| 8,704,564 B2 * | 4/2014 | Hasegawa | H03L 7/093 |
| | | | 327/156 |
| 9,379,731 B1 | 6/2016 | Roham | |
| 2003/0155903 A1 | 8/2003 | Gauthier et al. | |
| 2009/0063070 A1 | 3/2009 | Renneberg | |
| 2011/0057731 A1 | 3/2011 | Youssef et al. | |
| 2013/0272341 A1 | 10/2013 | Lee et al. | |
| 2014/0086279 A1 | 3/2014 | Cao et al. | |
| 2015/0207498 A1 * | 7/2015 | Raimondi | H03F 1/32 |
| | | | 327/133 |

OTHER PUBLICATIONS

Rethy J.V., et al., "Supply-Noise-Resilient Design of a BBPLL-Based Force-Balanced Wheatstone Bridge Interface in 130-nm CMOS," IEEE Journal of Solid-State Circuits, Nov. 2013, vol. 48 (11), pp. 2618-2627.

* cited by examiner ten# RESISTOR-CAPACITOR OSCILLATOR (RCO) WITH DIGITAL CALIBRATION AND QUANTIZATON NOISE REDUCTION

FIELD

Aspects of the present disclosure relate generally to oscillators, and in particular, to a resistor-capacitor oscillator (RCO) with digital frequency calibration and quantization noise reduction.

DESCRIPTION OF RELATED ART

An integrated circuit (IC), such as a system on chip (SOC), may employ an oscillator to generate a clock for driving of one or more digital processing cores of the IC. For the sake of using the IC footprint efficiently, the oscillator should be designed such that it does not occupy a lot of area of the IC. Also, for the sake of conserving power, the oscillator should also not consume too much power. Additionally, as the rate at which the one or more signal processing cores of the IC perform their operations may be of interest, the oscillator should be easily calibratable to achieve a target frequency or frequency range for the clock.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes a switched capacitor; a low pass filter (LPF) including an input coupled to an output of the switched capacitor; a reference voltage generator; an integrator including a first input coupled to an output of the LPF and a second input coupled to an output of the reference voltage generator; a voltage controlled oscillator (VCO) including an input coupled to an output of the integrator; a frequency divider including an input coupled to an output of the VCO; and a switched capacitor driver including an input coupled an output of the frequency divider, wherein the switched capacitor includes an input coupled to an output of the switched capacitor driver.

Another aspect of the disclosure relates to an apparatus. The apparatus includes a switched capacitor configured to generate a sawtooth or ramp voltage in response to a switched capacitor drive signal; a low pass filter (LPF) configured to filter the sawtooth or ramp voltage to generate a filtered voltage; a reference voltage generator configured to generate a reference voltage; an integrator configured to integrate a difference between the sawtooth or ramp voltage and the reference voltage to generate a frequency control signal; a voltage controlled oscillator (VCO) configured to generate first clock based on the frequency control signal; a frequency divider configured to frequency divide the first clock to generate a second clock; and a switched capacitor driver configured to generate the switched capacitor drive signal in response to the second clock.

Another aspect of the disclosure relates to a method. The method includes generating a sawtooth or ramp voltage in response to a switched capacitor drive signal; filtering the sawtooth or ramp voltage to generate a filtered voltage; generating a reference voltage; integrating a difference between the sawtooth or ramp voltage and the reference voltage to generate a frequency control signal; generating a first clock based on the frequency control signal; frequency dividing the first clock to generate a second clock; and generating the switched capacitor drive signal based on the second clock.

Another aspect of the disclosure relates to a wireless communication device. The wireless communication device includes an oscillator including a switched capacitor; a low pass filter (LPF) including an input coupled to an output of the switched capacitor; a reference voltage generator; an integrator including a first input coupled to an output of the LPF and a second input coupled to an output of the reference voltage generator; a voltage controlled oscillator (VCO) including an input coupled to an output of the integrator; a frequency divider including an input coupled to an output of the VCO; and a switched capacitor driver including an input coupled an output of the frequency divider, wherein the switched capacitor includes an input coupled to an output of the switched capacitor driver; a signal processing core coupled to the oscillator; a transceiver coupled to the signal processing core; and at least one antenna coupled to the transceiver.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Resistor-capacitor oscillators (RCOs) are often employed as low power replacements for crystal oscillators for generating stable periodic oscillating signal or clock. RCOs acquire their name because their output oscillating signal has a frequency f related to an inverse of the multiplication of the resistance R of a resistor and capacitance C of a capacitor (e.g., f 1/RC). RCOs often employ a switch-capacitor circuit for generating a sawtooth or ramp voltage whose slope is proportional to a charging rate of a capacitor. A reference voltage is generated by supplying a current through a resistor. A comparator is employed to compare the sawtooth or ramp voltage with the reference voltage to generate the output oscillating signal, whose frequency f is inversely related to the resistance R of the resistor and the capacitance C of the capacitor.

There are several drawbacks with comparator-based RCOs. First, the power drawn by the comparator is a function of the frequency of the oscillating signal, which basically limits the frequency f to about 100 megahertz (MHz). Second, in order to achieve frequencies in the gigahertz (GHz) range, for example, a phase locked loop (PLL) or frequency lock loop (FLL) is typically employed to multiply the frequency of the output oscillating signal of an RCO. A PLL/FLL typically occupies substantial integrated circuit (IC) footprint and consumes significant power. Third, to achieve an accurate target frequency (e.g., to within one percent (1%) accuracy), a resistor, capacitor, or current mirror array with 10 bits of resolution is typically employed to accurately set the slope of the sawtooth or ramp voltage to accurately achieve the target frequency f for the output oscillating signal. Such resistor, capacitor, or current mirror array consumes significant IC footprint and power.

Figure 1:
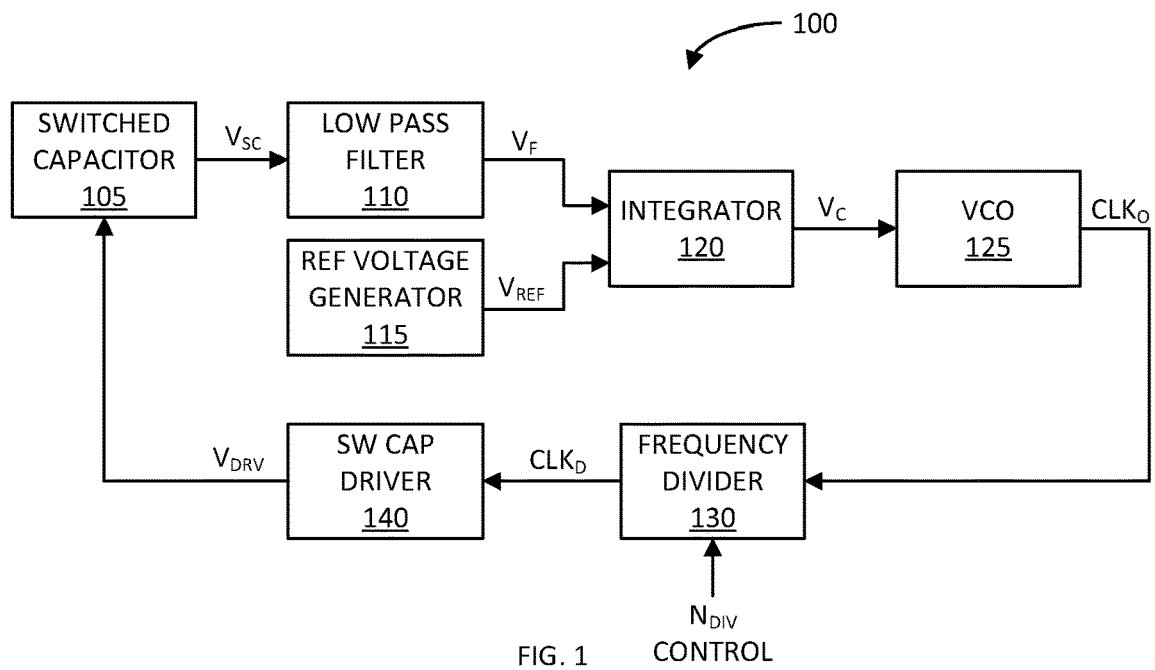
FIG. 1 illustrates a block diagram of an exemplary resistor-capacitor oscillator (RCO) in accordance with an aspect of the disclosure.

FIG. 1 illustrates a block diagram of an exemplary resistor-capacitor oscillator (RCO) 100 in accordance with an aspect of the disclosure. The RCO 100 includes a switched capacitor 105, a low pass filter (LPF) 110, a reference voltage generator 115, an integrator 120, a voltage-controlled oscillator (VCO) 125, a frequency divider 130, and a switched capacitor driver 140.

The switched capacitor 105 is configured to generate a sawtooth or ramp voltage $V_{SC}$ that is substantially periodic with a frequency $f_{SC}$ related to an inverse of a multiplication of a resistance R of a resistor and a capacitance C of a capacitor (e.g., $f_{SC} \sim 1/RC$), as discussed further herein with regard to a more detailed implementation. The switched capacitor 105 includes an output, at which the sawtooth or ramp voltage $V_{SC}$ is generated, coupled to an input of the LPF 110.

The LPF 110 is configured to low pass filter the sawtooth or ramp voltage $V_{SC}$ to generate a filtered voltage $V_F$, which varies less or has less ripple than the sawtooth or ramp voltage $V_{SC}$. The LPF 110 includes an output, at which the filter voltage $V_F$ is generated, coupled to a first input of the integrator 120. The reference voltage generator 115 is configured to generate a substantially constant reference voltage $V_{REF}$. The reference voltage generator 115 includes an output, at which the reference voltage $V_{REF}$ is generated, coupled to a second input of the integrator 120.

The integrator 120 is configured to integrate a difference between the filtered voltage $V_F$ and the reference voltage $V_{REF}$ to generate a frequency control voltage $V_C$ for the VCO 125. The integrator 120 includes an output, at which the frequency control voltage $V_C$ is generated, coupled to a frequency control input of the VCO 125. The VCO 125 is configured to generate an output oscillating signal or clock $CLK_O$ based on the frequency control voltage $V_C$. The VCO 125 includes an output, at which the output clock $CLK_O$ is generated, coupled to an input of the frequency divider 130.

The frequency divider 130 is configured to frequency divide the output clock $CLK_O$ to generate a frequency divided clock $CLK_D$. The frequency divider 130 is configured to frequency divide the output clock $CLK_O$ based on an $N_{mv}$ control signal, which is used to set the divider ratio $N_{DIV}$, being the frequency $f_O$ of the output clock $CLK_O$ over the frequency $f_{SC}$ of the sawtooth or ramp voltage $V_{SC}$ (e.g., $N_{DIV} = f_O/f_{SC}$). The frequency divider 130 includes an output, at which the frequency divided clock $CLK_D$ is generated, coupled to an input of the switched capacitor driver 140.

The switched capacitor driver 140 is configured to generate a drive voltage $V_{DRV}$ for the switched capacitor 105 so that the latter generates the sawtooth or ramp voltage $V_{SC}$ such that its frequency $f_{SC}$ is substantially equal to the frequency $f_O$ of the output clock $CLK_O$ divided by the frequency divider ratio $N_{DIV}$ as set by the $N_{DIV}$ control signal. The switched capacitor driver 140 includes an output, at which the drive voltage $V_{DRV}$ is generated, coupled to an input of the switched capacitor 105.

Figure 2A:
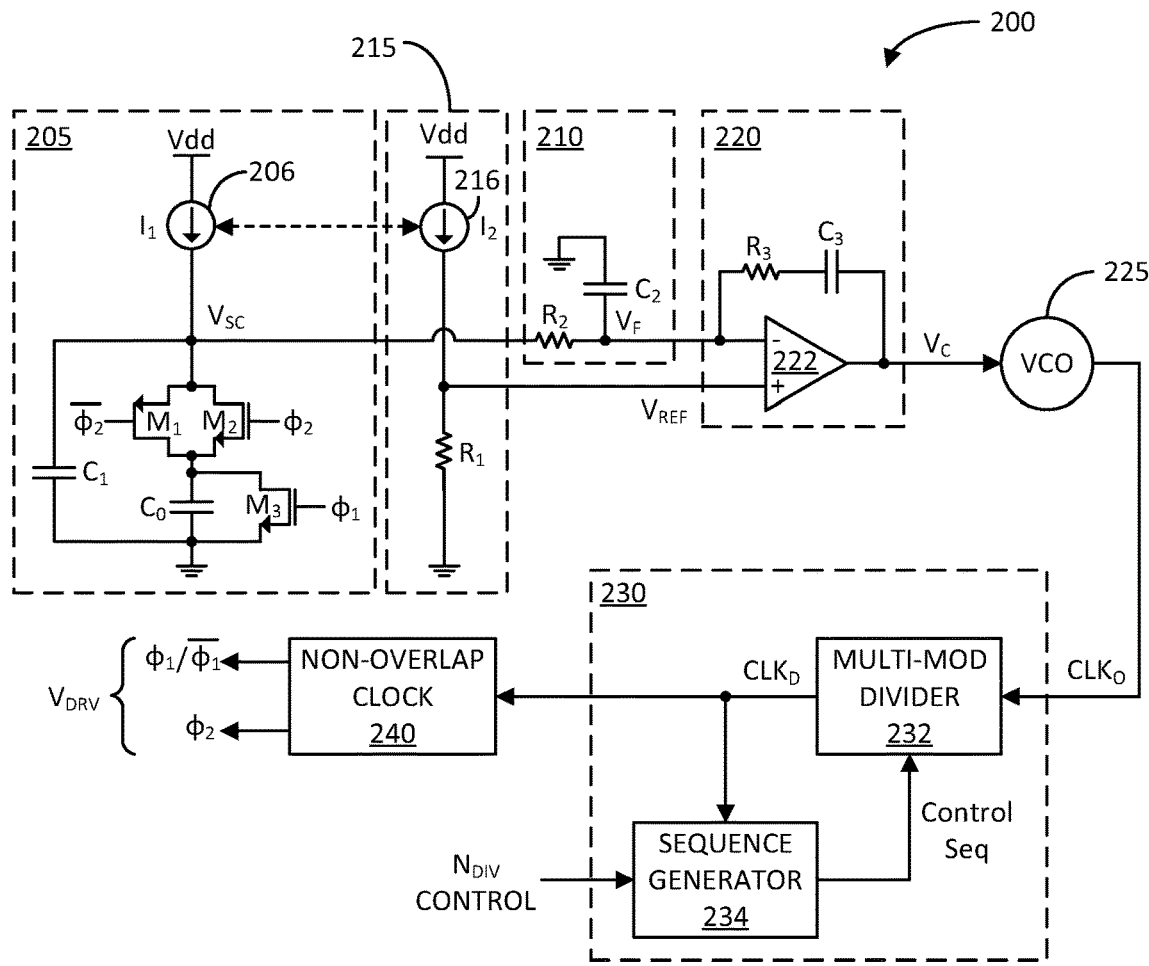
FIG. 2A illustrates a schematic diagram of another exemplary resistor-capacitor oscillator (RCO) in accordance with another aspect of the disclosure.

FIG. 2A illustrates a schematic diagram of another exemplary resistor-capacitor oscillator (RCO) 200 in accordance with another aspect of the disclosure. The RCO 200 is an example of a more detailed implementation of the RCO 100 previously discussed. The RCO 200 includes a switched capacitor 205, a low pass filter (LPF) 210, a reference voltage generator 215, an integrator 220, a voltage-controlled oscillator (VCO) 225, a frequency divider 230, and a switched-capacitor driver (e.g., a non-overlapping clock) 240.

The switched capacitor 205 is configured to generate a sawtooth or ramp voltage $V_{SC}$. The switched capacitor 205 includes a current source 206, a first switching device $M_1/M_2$, a second switching device $M_3$, a capacitor $C_0$, and a decoupling capacitor $C_1$. The current source 206 is coupled in series with the first switching device $M_1/M_2$ and the capacitor $C_0$ between an upper voltage rail Vdd and a lower voltage rail (e.g., ground). The second switching device $M_3$ is coupled in parallel with the capacitor $C_0$. The decoupling capacitor $C_1$ is coupled in parallel with the series connection of the first switching device $M_1/M_2$ and the capacitor $C_0$.

The first switching device $M_1/M_2$ may be configured as a dual switching device or complementary metal oxide semiconductor (CMOS) device, such as a transmission gate or pass gate. However, it shall be understood that the first switching device may be implemented as a single switching device. In this example, the switching device $M_1$ may be configured as a p-channel metal oxide semiconductor field effect transistor (PMOS FET) and the switching device $M_2$ may be configured as an n-channel metal oxide semiconductor field effect transistor (NMOS FET). The second switching device $M_3$ may be configured as a single switching device, such as an NMOS FET. However, it shall be understood that the second switching device may be configured as a dual switching device or CMOS device, such as a transmission gate or pass gate.

A drive signal $V_{DRV}$ for the switched capacitor 205 may include non-overlapping clocks $\varphi_1$ and $\varphi_2$. The non-overlapping clock $\varphi_2$ and its complementary $\overline{\varphi_2}$ are applied to gates of the first switching device $M_1/M_2$, respectively. The non-overlapping clock $\varphi_1$ is applied to the gate of the second switching device $M_3$. The switched capacitor 205 is configured to generate the sawtooth or ramp voltage $V_{SC}$ at a node between the current source 206 and the first switching device $M_1/M_2$.

The switched capacitor 205 operates as follows: When the non-overlapping clocks $\varphi_1$ and $\varphi_2$ of the drive voltage $V_{DRV}$ are low (e.g., ground) and high (e.g., Vdd), respectively, the first switching device $M_1/M_2$ is turned on (closed), and the second switching device $M_3$ is turned off (open). The turning on of the first switching device $M_1/M_2$ couples a substantially discharged capacitor $C_0$ across the decoupling capacitor $C_1$. Due to charge sharing between the capacitors $C_0$ and $C_1$, charges flow from the decoupling capacitor $C_1$ to the capacitor $C_0$. This produces a falling edge of the sawtooth or ramp voltage $V_{SC}$.

When the non-overlapping clocks $\varphi_1$ and $\varphi_2$ of the drive voltage $V_{DRV}$ are high (e.g., Vdd) and low (e.g., ground), respectively, the first switching device $M_1/M_2$ is turned off (open), and the second switching device $M_3$ is turned on (closed). The turning off of the first switching device $M_1/M_2$ decouples the current source 206 from the capacitor $C_0$ to prevent charging of the capacitor $C_0$ by the current $I_1$. The turning on of the second switching device $M_3$ shorts and substantially fully discharges the capacitor $C_0$. The decoupling capacitor $C_0$, having depleted some of its charge in the previous phase, continuous to be charged by the current $I_1$ of the current source 206. This produces the rising portion of the sawtooth or ramp voltage $V_{SC}$.

The reference voltage generator 215 is configured to generate a substantially constant reference voltage $V_{REF}$. The reference voltage generator 215 includes a current source 216 coupled in series with a resistor $R_1$ between the upper voltage rail Vdd and the lower voltage rail (e.g., ground). The current source 216 is configured to generate a current $I_2$ that flows through the resistor $R_1$ to generate the reference voltage $V_{REF}$ at a node between the current source 216 and the resistor $R_1$. As indicated by the dashed dual-arrow line connecting the current sources 206 and 216, the current sources 206 and 216 may be configured as a current mirror, where the current $I_1$ is related to (e.g., the same or a specific ratio of) the current $I_2$.

The LPF 210 is configured to low pass filter the sawtooth or ramp voltage $V_{SC}$ to generate a filtered voltage $V_F$ that is smoother or includes less ripples than the sawtooth or ramp voltage $V_{SC}$. Accordingly, the node or output of the switched capacitor 205, at which the sawtooth or ramp voltage $V_{SC}$ is produced, is coupled to an input of the LPF 210. The LPF 210 includes a series resistor $R_2$ coupled between the input and an output of the LPF 210, where the filtered voltage $V_F$ is produced, and a shunt capacitor $C_2$ coupled between the output of the LPF 210 and the lower voltage rail (e.g., ground).

The integrator 220 is configured to integrate a difference between the filtered voltage $V_F$ and the reference voltage $V_{REF}$ to generate a frequency control signal $V_C$ for the VCO 225. Accordingly, the output of the LPF 210, at which the filtered voltage $V_F$ is produced, is coupled to a first input of the integrator 220, and the output of the reference voltage generator 215, at which the reference voltage $V_{REF}$ is generated, is coupled to a second input of the integrator 220.

More specifically, the integrator 220 includes an operational amplifier 222, an integrating capacitor $C_3$, and a feedback resistor $R_3$. The integrating capacitor $C_3$ is coupled in series with the feedback resistor $R_3$ between an output and a negative input of the operational amplifier 222. The feedback resistor $R_3$ compensates for a frequency response pole generated by the switched capacitor 205. The output of the of the LPF 210 is coupled to the negative input of the operational amplifier 222, the output of the reference voltage generator 215 is coupled to a positive input of the operational amplifier 222, and the output of the operational amplifier 222, at which the frequency control voltage $V_C$ is produced, is coupled to an input of the VCO 225.

The VCO 225 is configured to generate an output clock $CLK_O$ based on the frequency control voltage $V_C$. The VCO 225 may include a ring oscillator (RO), and the frequency control voltage $V_C$ may control the supply voltage or current provided to the RO to control the frequency $f_O$ of the output clock $CLK_O$.

The frequency divider 230 is configured to frequency divide the output clock $CLK_O$ to generate a frequency divided clock $CLK_D$. Accordingly, the output of the VCO 225, at which the output clock $CLK_O$ is generated, is coupled to an input of the frequency divider 230. The frequency divider 230 may be configured as a fractional divider. In this regard, the frequency divider 230 includes a multi-modulus divider 232 and a sequence generator 234. The output of the VCO 225 is coupled to an input of the multi-modulus divider 232. An output of the multi-modulus divider 232 is coupled to an input of the sequence generator 234. The sequence generator 234 includes an input configured to receive a divider ratio $N_{mv}$ control signal and an output to generate a control sequence based on the $N_{mv}$ control signal. The output of the sequence generator 234, at which the control sequence is generated, is coupled to an input of the multi-modulus divider 232.

The frequency divider 230 operates as follows: The multi-modulus divider 232 is configured to frequency divide the output clock $CLK_O$ by an integer N at a given time. The control sequence generated by the sequence generator 234 is configured to vary the integer N to generate an effective divider ratio $N_{mv}$, which may be given by the integer N plus a fractional component a. For example, if the target divider ratio $N_{mv}$ set by the $N_{mv}$ control signal is 6.5, then the integer N is six (6) and the fractional component a is +0.5. Accordingly, in a simple example, the control sequence generated by the sequence generator 234 may cause the multi-modulus divider 232 to toggle between N being six (6) and N being seven (7) to generate a mean of 6.5. Thus, the mean of the control sequence sets the effective divider ratio $N_{mv}$ of the multi-modulus divider 232.

The frequency divided clock $CLK_D$ is provided to a clock input of the sequence generator 234 to control the timing of the control sequence. The sequence generator 234 may be configured as a sigma-delta modulator (e.g., $2^{nd}$ order $\Sigma$-$\Delta$, modulator) or other type of sequence generator 234. The sequence generator 234 may be configured to generate the control sequence to shape a quantization noise associated with the frequency divided clock $CLK_D$. For example, the control sequence may vary the integer N to push quantization noise in the frequency domain to a higher frequency spectrum. The high frequency quantization noise may be substantially filtered out by the LPF 210 of the RCO 200.

The switched capacitor driver 240, which may be configured as a non-overlapping clock, is configured to generate the non-overlapping clocks ($\varphi_2$ and $\varphi_1$ of the drive voltage $V_{DRV}$ to drive the first switching device $M_1/M_2$ and the second switching device $M_3$, respectively.

Figure 2B:
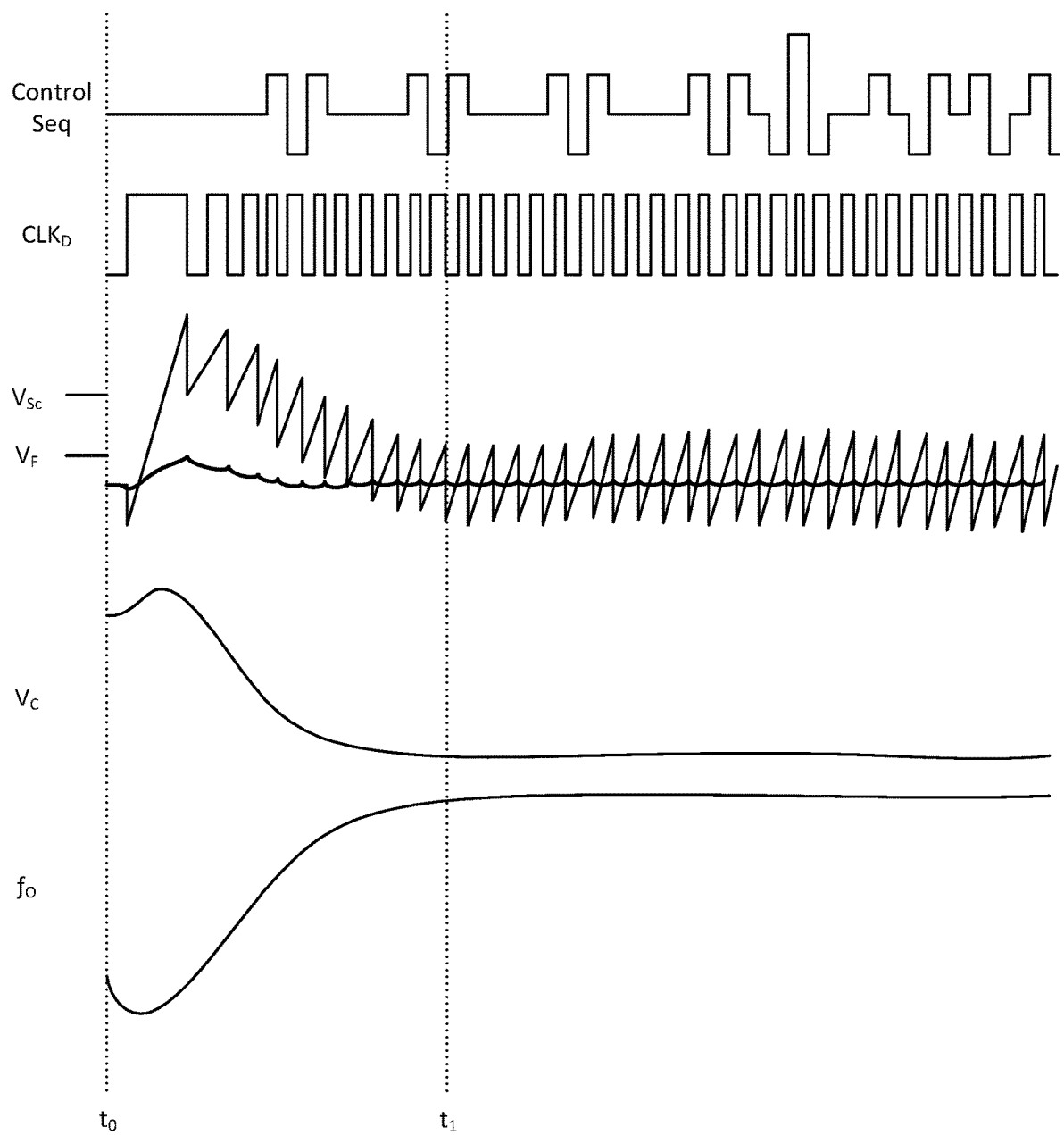
FIG. 2B illustrates a timing diagram of various signals related to an example operation of the RCO of FIG. 2A in accordance with another aspect of the disclosure.

FIG. 2B illustrates a timing diagram of various signals related to an example operation of the RCO 200 in accordance with another aspect of the disclosure. The x- or horizontal-axis of the timing diagram represents time. The y- or vertical-axis represents magnitude of various signals, such as, from top-to-bottom, the control sequence, the frequency divided clock $CLK_D$, the sawtooth or ramp voltage $V_{SC}$ superimposed on the filtered voltage $V_F$, the frequency control voltage $V_C$, and the frequency $f_O$ of the output clock $CLK_O$.

Upon start-up of the RCO 100 at time $t_0$, the control sequence is initiated to an integer value N. As indicated, at time $t_0$, the sawtooth or ramp voltage $V_{SC}$, the filtered voltage $V_F$, and the frequency control voltage $V_C$ may be above its settling value, which causes the VCO 225 to generate the output clock $CLK_O$ with a frequency $f_O$ lower than a target frequency. The frequency divider 230 begins to frequency divide the output clock $CLK_O$ by the initial integer value N to generate the frequency divided clock $CLK_D$. As the loop begins to function, the sawtooth or ramp voltage $V_{SC}$, the filtered voltage $V_F$, and frequency control voltage $V_C$ decreases towards their respective settling values, and the frequency $f_O$ of the output clock $CLK_O$ increases towards its settling value or target frequency. By time $t_1$, the loop has substantially settled, and the parameters $V_{SW}$, $V_F$, $V_C$, and $f_O$ have substantially reached their respective settling values. Note that the control sequence moves between different integer values in order to achieve the effective divider ratio $N_{mv}$ as dictated by the $N_{mv}$ control signal, as previously discussed.

The RCO 200 has several significant advantages over comparator-based designs. First, the RCO 200 does not require a comparator, which consumes significant power when high frequency clocks are required; the power consumption being inversely related to the comparator delay. Thus, smaller comparator delays to achieve higher clock frequencies translate to higher power consumption. Second, because the RCO 200 does not require a comparator, it is able to achieve higher clock frequencies than a comparator-based RCO; and thus, need not require a PLL or FLL to multiply its clock frequency. This translates to significant IC area savings, as well as power consumption savings. Third, the frequency divider 230 of the RCO 200 may be used to calibrate or tune the frequency $f_O$ of the output clock $CLK_O$ in the digital domain; and thus, the RCO 200 does not require a resistor, capacitor, or current array, which would otherwise occupy substantial IC footprint and significant power, as well as require accurate matching among the various resistors, capacitors, and current sources of the array. Thus, in some low power, low cost or high security applications, a monolithic, calibratable, on-chip RC oscillator that can run at more than 500 MHz may be desired.

Figure 3:
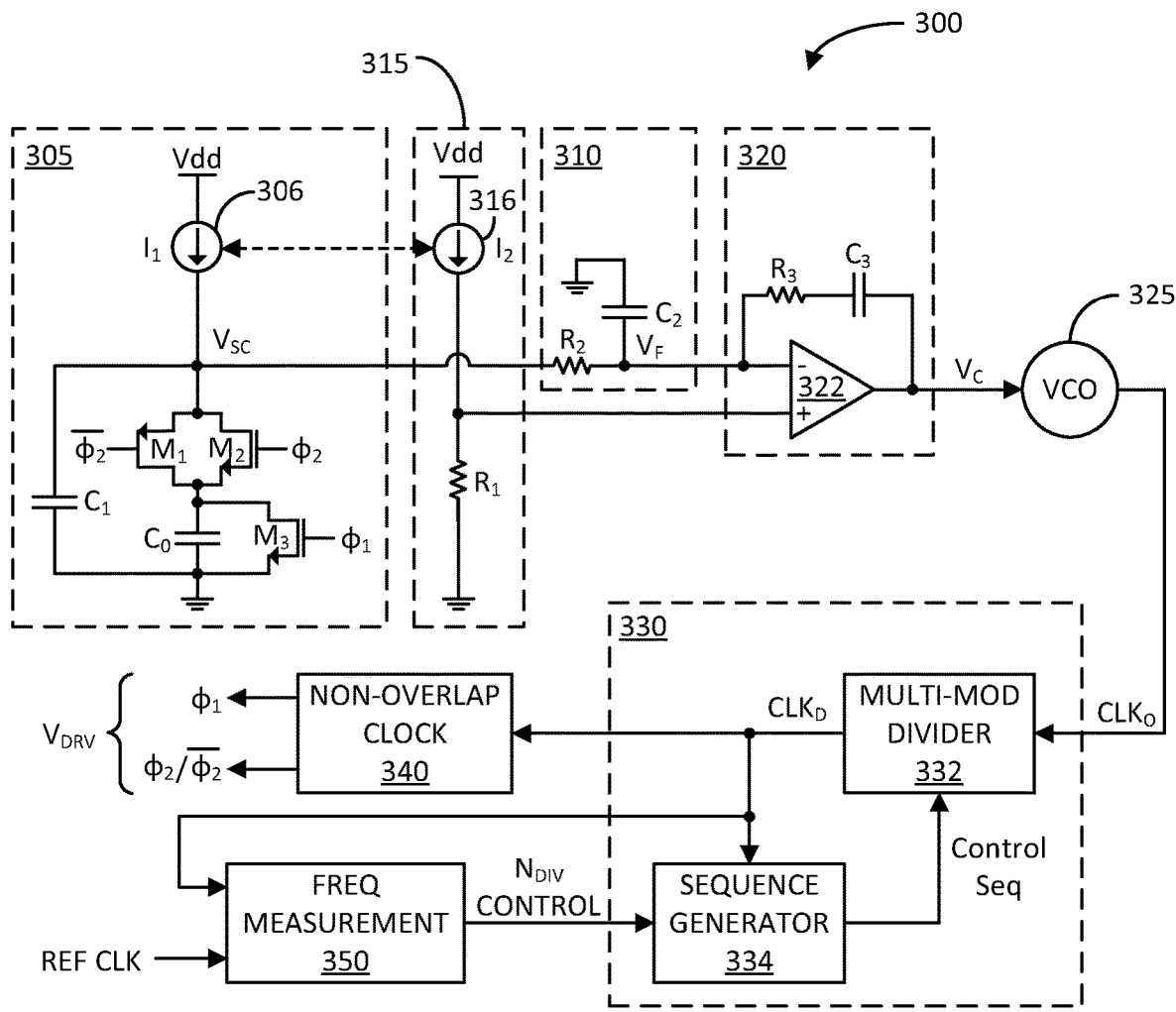
FIG. 3 illustrates a schematic diagram of another exemplary resistor-capacitor oscillator (RCO) in accordance with another aspect of the disclosure.

FIG. 3 illustrates a schematic diagram of another exemplary resistor-capacitor oscillator (RCO) 300 in accordance with another aspect of the disclosure. The RCO 300 is a variation of RCO 200 previously discussed. That is, the RCO 300 includes a switched capacitor 305, a reference voltage generator 315, a low pass filter (LPF) 310, an integrator 320, a VCO 325, a frequency divider 330 including a multi-modulus divider 332 and a sequence generator 334, and a switched capacitor driver (e.g., non-overlapping clock) 340. The elements internal to the aforementioned components are similar to those in RCO 200 as indicated by the same reference identifiers and/or reference numbers with the most significant digit being a "3" instead of a "2".

The RCO 300 differs from RCO 200 in that RCO 300 further includes a frequency measurement circuit 350 to measure the frequency $f_{SC}$ of the sawtooth or ramp voltage $V_{SW}$ generated by the switched capacitor 305. When the loop has settled, the frequency of the frequency divided clock $CLK_D$ is substantially the same as the frequency $f_{SC}$ of the sawtooth or ramp voltage $V_{SW}$. Accordingly, the frequency measurement circuit 350 includes a first input coupled to an output of the multi-modulus divider 332 to receive the frequency divided clock $CLK_D$. The frequency measurement circuit 350 includes a second input configured to receive a reference clock (REF CLK) with a known frequency from, for example, an external crystal oscillator during, for example, factory calibration.

The frequency measurement circuit 350 is able to determine the frequency of the frequency divided clock $CLK_D$, which is substantially the same as the frequency of the sawtooth or ramp voltage $V_{SW}$ when the loop has settled, using the reference clock. Once the frequency of the sawtooth or ramp voltage $V_{SC}$ is known, the frequency measurement circuit 350 may set the frequency $f_O$ of the output clock $CLK_O$ via the divider ratio $N_{DIV}$ control signal per the equation $f_O = f_{SC} * N_{DIV}$.

Figure 4:
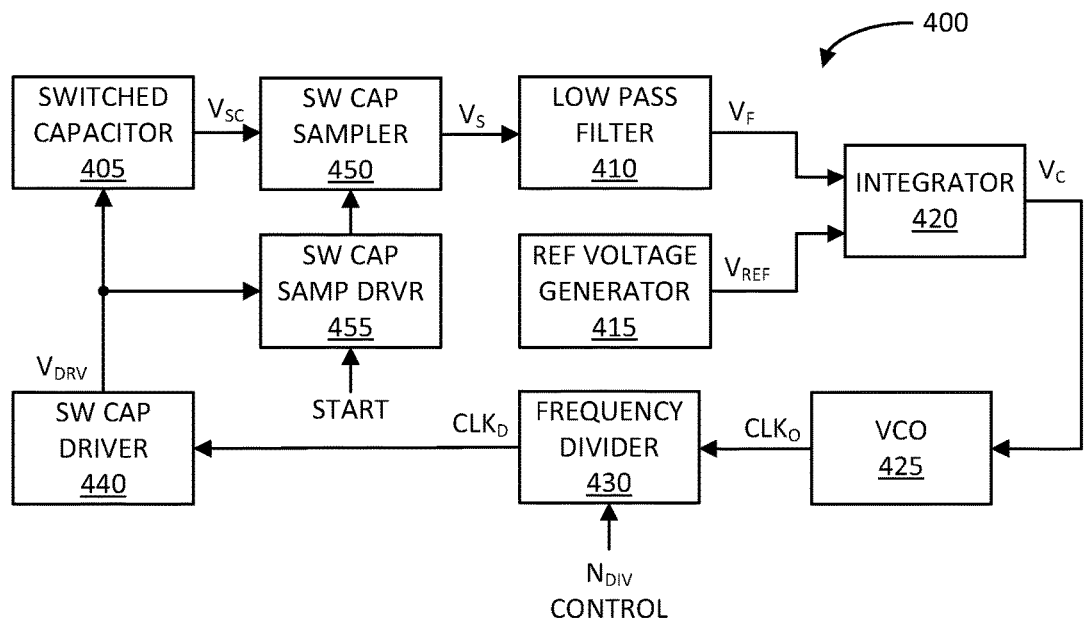
FIG. 4 illustrates a block diagram of another exemplary resistor-capacitor oscillator (RCO) in accordance with another aspect of the disclosure.

FIG. 4 illustrates a block diagram of another exemplary resistor-capacitor oscillator (RCO) 400 in accordance with another aspect of the disclosure. The RCO 400 is similar to that of RCO 100 previously discussed, and includes a switched capacitor 405, a low pass filter (LPF) 410, a reference voltage generator 415, an integrator 420, a voltage controlled oscillator (VCO) 425, a frequency divider 430, and a switched capacitor driver 440. The RCO 400 differs from RCO 100 in that RCO 400 further includes a switched capacitor sampler 450 and a switched capacitor sampler driver 455.

As previously discussed, the frequency divider 430, which may be a digital fractional divider, produces a frequency divided clock $CLK_D$ with quantization noise (because it is switching between different integers N to achieve a fractional component). Also, as previously discussed, the LPF 410 may be able to remove most of the quantization noise, as the noise shaping capability of the frequency divider 430 pushes the quantization noise to a higher frequency region that may be filtered out. However, to remove most of the quantization noise, the capacitor of the LPF 410 may need to be relatively large. Thus, to substantially remove the quantization noise, while maintaining the capacitor of the LPF 410 relatively small, the switched capacitor sampler 450 and the switched capacitor sampler driver 455 assist in further reducing the quantization noise.

During a first-time interval (e.g., M/2 number of periods of the frequency divided clock $CLK_D$), the switched capacitor sampler 450 averages and tracks the sawtooth or ramp voltage $V_{SC}$ with a sampling capacitor while keeping the sampling capacitor decoupled from the LPF 410. Then, during a second time interval (e.g., the following M/2 number of periods of the frequency divided clock $CLK_D$), the switched capacitor sampler 450 samples the sawtooth or ramp voltage $V_{SC}$ and provides it to the LPF 410, while decoupling the sampling capacitor from the switched capacitor 405. Accordingly, the tracking and sampling operation effectively operates as an additional low pass filter to substantially remove the quantization noise from the sawtooth or ramp voltage $V_{SC}$. The tracking and sampling are repeated while the switched capacitor sampler 450 is enabled.

The switched capacitor sampler driver 455 controls the timing of the first and second intervals based on the frequency divided clock $CLK_D$. The switched capacitor sampler driver 455 includes an input coupled to an output of the switched capacitor driver 440, and an output coupled to the switched capacitor sampler 450. In this regard, the switched capacitor sampler driver 455 couples the sampling capacitor to the switched capacitor sampler and decouples the sampling capacitor from the LPF 410 for M/2 periods of the frequency divided clock $CLK_D$, and then couples the sampling capacitor to the LPF 410 and decouples the sampling capacitor from the switched capacitor 405 for the following M/2 periods of the frequency divided clock $CLK_D$.

Additionally, during start-up while the loop is settling as indicated by a start signal, the switched capacitor sampler driver 455 continuously couples the switched capacitor 405 to the LPF 410 to achieve an effective large loop bandwidth so that the loop settles much faster. Then, when the loop has sufficiently settled as indicated by the start signal, the switched capacitor sampler driver 455 operates the switched capacitor sampler 450 as discussed above to track the voltage $V_{SC}$ over M/2 periods, and sample the voltage $V_{SC}$ to provide a smoother (less ripple) sampled voltage $V_S$ to the LPF 410 during the following M/2 periods. The start signal may be any signal that indicates whether the loop has settled, such as, for example, based on the frequency control voltage $V_C$ not varying above a threshold over a certain duration.

Figure 5A:
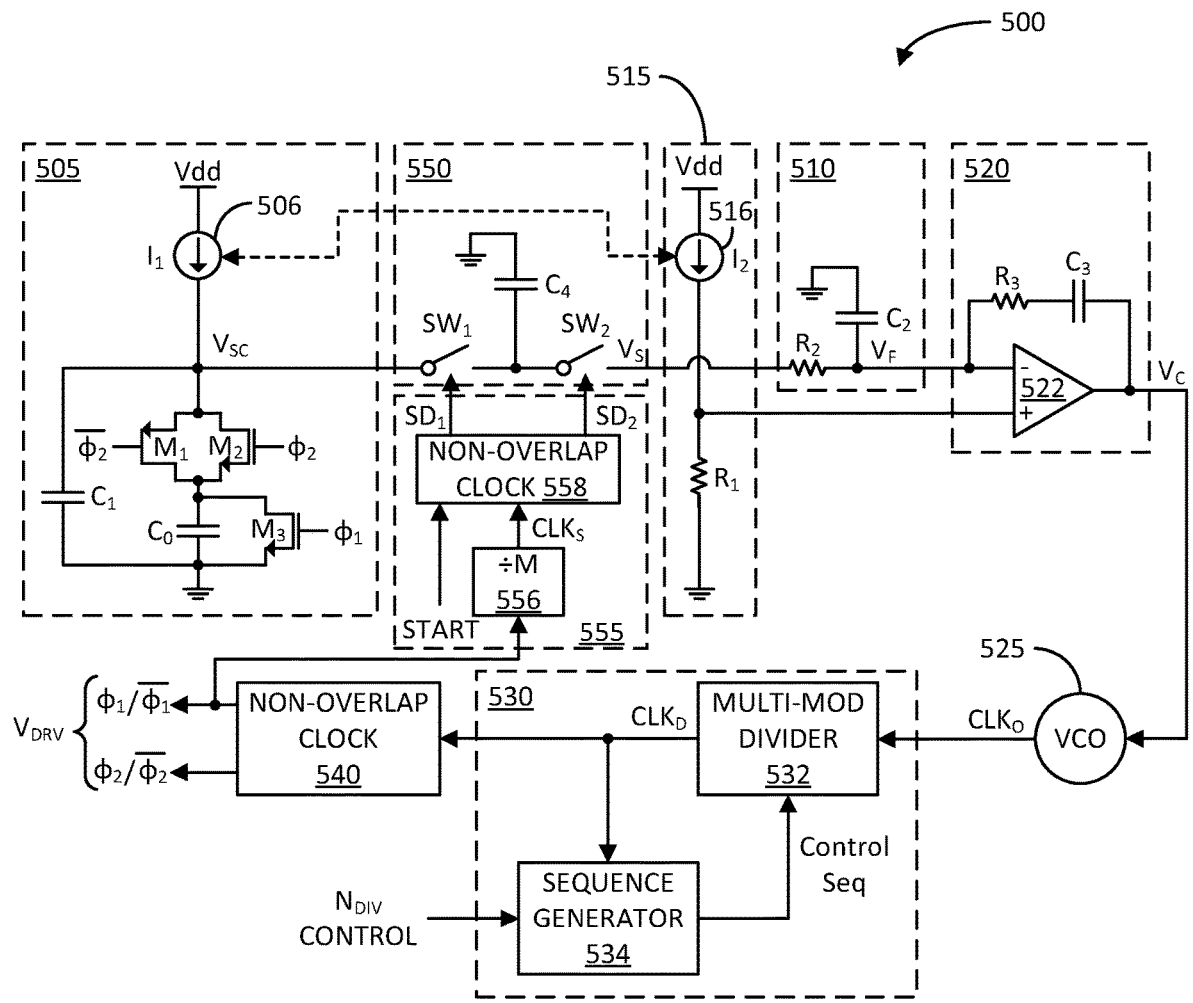
FIG. 5A illustrates a schematic diagram of another exemplary resistor-capacitor oscillator (RCO) in accordance with another aspect of the disclosure.

FIG. 5A illustrates a schematic diagram of another exemplary resistor-capacitor oscillator (RCO) 500 in accordance with another aspect of the disclosure. The RCO 500 is an example of a more detailed implementation of the RCO 400 previously discussed. The RCO 500 includes a switched capacitor 505, a switched capacitor sampler 550, a switched capacitor sampler driver 555, a low pass filter (LPF) 510, a reference voltage generator 515, an integrator 520, a voltage controlled oscillator (VCO) 525, a frequency divider 530 including a multi-modulus divider 532 and a sequence generator 534, and a switched capacitor driver (e.g., a non-overlapping clock) 540. The components 505, 510, 515, 520, 530 including 532 and 534, and 540 of the RCO 500 are essentially the same as the corresponding components in RCO 200 previously discussed.

The switched capacitor sampler 550 includes a first switching device $SW_1$, a sampling capacitor $C_4$, and a second switching device $SW_2$. The first switching device $SW_1$ is coupled between the output of the switched capacitor 505 and an internal node. The sampling capacitor $C_4$ is coupled between the internal node and the lower voltage rail (e.g., ground). The second switching device $SW_2$ is coupled between the internal node and the input of the LPF 510.

The switched capacitor sampler driver 555 includes a frequency divider 556 and a non-overlapping clock 558. The frequency divider 556 includes an input coupled to an output of the switched capacitor driver 540 to receive the non-overlapping clock $\overline{\varphi_1}$ (complementary clock $\varphi_1$). The frequency divider 556 divides the frequency of the non-overlapping clock by an integer $\overline{\varphi_1}$ to generate a sampler clock $CLK_S$. The non-overlapping clock 558 generates switch driver signals $SD_1$ and $SD_2$ for the first and second switching devices $SW_1$ and $SW_2$ based on the sampler clock $CLK_S$, respectively. The start signal, as previously discussed, may be applied to the non-overlapping clock 558.

Figure 5B:
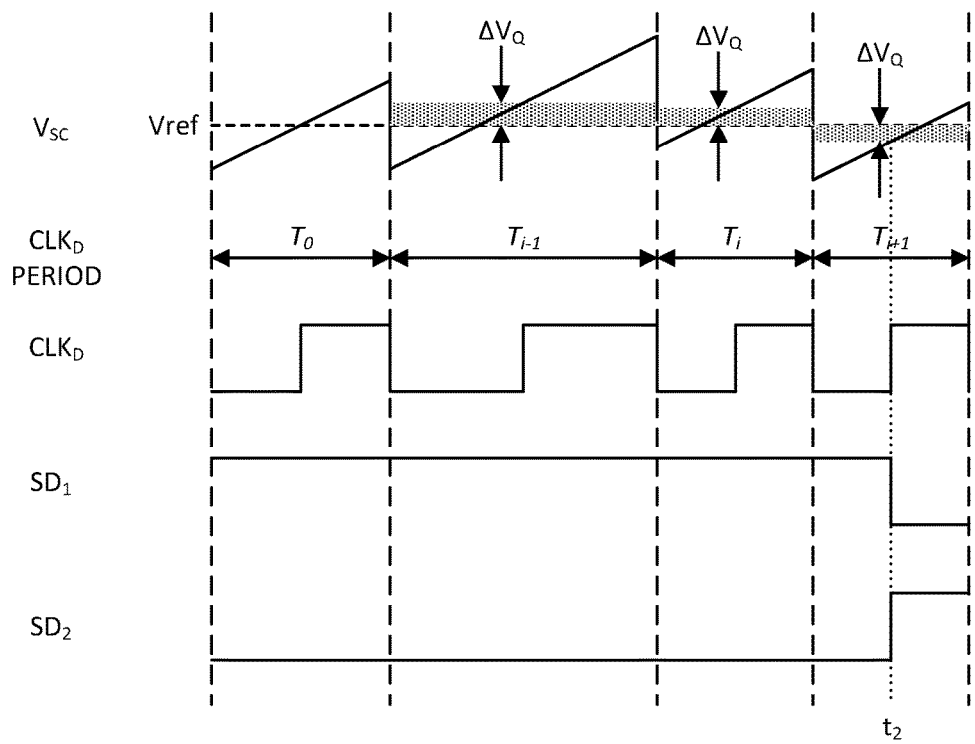
FIG. 5B illustrates a timing diagram of various signals related to an example operation of the RCO of FIG. 5A in accordance with another aspect of the disclosure.

FIG. 5B illustrates a timing diagram of various signals related to an example operation of the RCO 500 in accordance with another aspect of the disclosure. The x- or horizontal-axis of the timing diagram represents time. The y- or vertical-axis represents magnitude of various signals, such as, from top-to-bottom, the sawtooth or ramp voltage $V_{SC}$, the period T of the frequency divided clock $CLK_D$, the frequency divided clock $CLK_D$, the first switch driver signal $SD_1$, and the second switch driver signal $SD_2$.

Prior to time $t_2$ as depicted (for a time interval of M/2 periods of the frequency divided clock $CLK_D$), the non-overlapping clock 558 of the switched capacitor sampler driver 554 generates the first switch drive signal $SD_1$ at an asserted level, and generates the second switch drive signal $SD_2$ at a deasserted level. This causes the first switching device $SW_1$ to be turned on (closed), and the second switching device $SW_2$ to be turned off (open). The first switching device $SW_1$ being closed couples the output of the switched capacitor 505 to the sampling capacitor $C_4$ allowing it to track the sawtooth or ramp voltage $V_{SC}$ across the decoupling capacitor $C_1$. The decoupling capacitor $C_1$ in conjunction with the sampling capacitor $C_4$ effectively averages the quantization noise $\Delta V_Q$ per period. The second switching device $SW_2$ being open decouples the sampling capacitor $C_4$ from the LPF 510 to prevent the voltage ripple of the sawtooth or ramp voltage $V_{SC}$ from being applied to the LPF 510.

More specifically, in first time interval (M/2 cycles before $t_2$), the switched capacitor sampler 550 is coupled to switched capacitor 505 to sample the sawtooth or ramp voltage $V_{SC}$. As shown in FIG. 5B, the quantization noise $\Delta V_Q$ is accumulated on top of sampling capacitor $C_4$ during first time interval. Accumulating is a kind of low pass filtering by adding up quantization noise on an integrator (herein the integrator is the sampling capacitor $C_4$). Sampling itself causes aliasing of high frequency noise. But the quantization noise $\Delta V_Q$ is accumulated ahead of sampling, where the accumulation low pass filters the signal $V_{SC}$ to avoid aliasing during the sampling phase. That is how this sampling filter 550 may remove high frequency quantization noise.

At time $t_2$ and for the next M/2 periods of the frequency divided clock $CLK_D$, the non-overlapping clock 558 of the switched capacitor sampler driver 554 generates the first switch drive signal $SD_1$ at a deasserted level, and generates the second switch drive signal $SD_2$ at an asserted level. This causes the first switching device $SW_1$ to be turned off (open), and the second switching device $SW_2$ to be turned on (closed). The first switching device $SW_1$ being open decouples the output of the switched capacitor 505 from the sampling capacitor $C_4$. The second switching device $SW_2$ being closed couples the sampling capacitor $C_4$ to the LPF 510 to provide the stored sampled (average) voltage $V_S$ to the LPF 510. The voltage tracking and sampling operation of the switched capacitor sampler 550 effectively operates similar to a low pass filter to substantially remove the quantization noise from the sawtooth or ramp voltage $V_{SC}$ to provide a smoother sampled voltage $V_S$ provided to the LPF 510.

Accordingly, during the second time interval (M/2 cycles after $t_2$), the switched capacitor sampler 550 is coupled to the following circuit to transfer accumulated $V_{SC}$ to loop filter 510. Thus, the filtering of the quantization noise is performed over two time intervals; together they complete the task of low pass filtering the quantization noise.

As illustrated, the non-overlapping clock $\overline{\varphi_1}$ being provided to the frequency divider 556 causes the switching devices $SW_1$ and $SW_2$ to change state at substantially the middle of the rising portion of the sawtooth or ramp voltage $V_{SC}$. This helps reduce fluctuations of the sampled voltage $V_S$ due to the voltage ripple on top of the decoupling capacitor $C_1$.

Figure 5C:
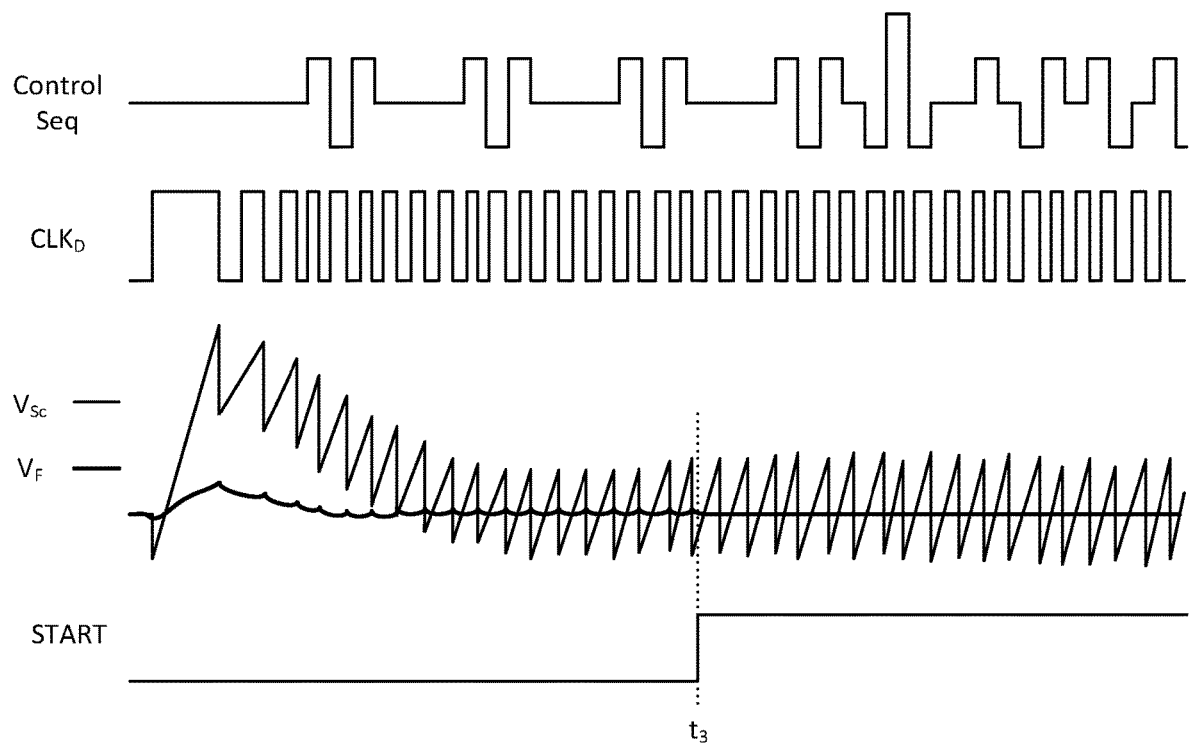
FIG. 5C illustrates another timing diagram of various signals related to an operation of the RCO of FIG. 5A in accordance with another aspect of the disclosure.

FIG. 5C illustrates a timing diagram of various signals related to an example operation of the RCO 500 in accordance with another aspect of the disclosure. The x- or horizontal-axis of the timing diagram represents time. The y- or vertical-axis represents magnitude of various signals, such as, from top-to-bottom, the control sequence, the frequency divided clock $CLK_D$, the sawtooth or ramp voltage $V_{SC}$ superimposed on the filtered voltage $V_F$, and the start signal.

As previously discussed, during a time interval prior to the start signal being asserted, when the loop has yet to settle, the non-overlapping clock 558 asserts both switch driver signals $SD_1$ and $SD_2$. This causes both the first and second switching devices $SW_1$ and $SW_2$ to turn on (closed). This continuously couples the switched capacitor 505 to the LPF 510, which results in a relatively large bandwidth so that the loop settles quickly. When the loop has sufficiently settled at time $t_3$, the start signal is asserted; and the non-overlapping clock 558 toggles the states of the switch driver signals $SD_1$ and $SD_2$ so that the switched capacitor sampler 550 tracks and samples the switched capacitor voltage $V_{SC}$ as previously. As illustrated by the timing diagram, the filtered voltage $V_F$ ceases to have significant ripple after the start signal is asserted.

Figure 6:
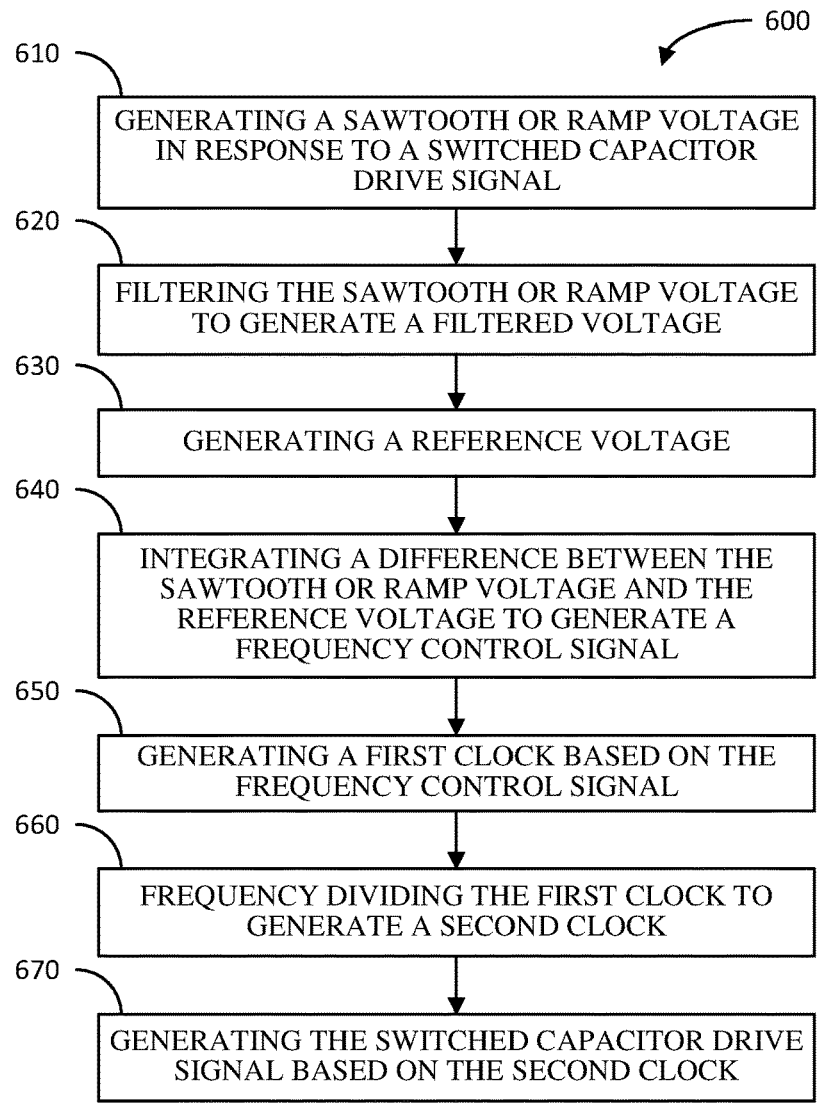
FIG. 6 illustrates a flow diagram of an exemplary method of generating a clock in accordance with another aspect of the disclosure.

FIG. 6 illustrates a flow diagram of an exemplary method 600 of generating a clock in accordance with another aspect of the disclosure. The method 600 includes generating a sawtooth or ramp voltage in response to a switched capacitor drive signal (block 610). An example of a means for generating a sawtooth or ramp voltage in response to a switched capacitor drive signal includes any of the switched capacitors described herein.

The method 600 further includes filtering the sawtooth or ramp voltage to generate a filtered voltage (block 620). An example of a means for filtering the sawtooth or ramp voltage to generate a filtered voltage includes any of the LPFs described herein. The method 600 additionally includes generating a reference voltage (block 630). An example of means for generating a reference voltage include any of the reference voltage generators described herein.

The method 600 also includes integrating a difference between the sawtooth or ramp voltage and the reference voltage to generate a frequency control signal (block 640). An example of means for integrating a difference between the sawtooth or ramp voltage and the reference voltage to generate a frequency control signal include any of the integrators described herein. Further, the method 600 includes generating a first clock based on the frequency control signal (block 650). An example of means for generating a first clock based on the frequency control signal includes any of the VCOs described herein.

Additionally, the method 600 includes frequency dividing the first clock to generate a second clock (block 660). An example of a means for frequency dividing the first clock to generate a second clock include any of the frequency dividers described herein. Further, the method 600 includes generating the switched capacitor drive signal based on the second clock (block 670). An example of means for generating the switched capacitor drive signal based on the second clock include any of the switched capacitor drivers described herein.

Figure 7:
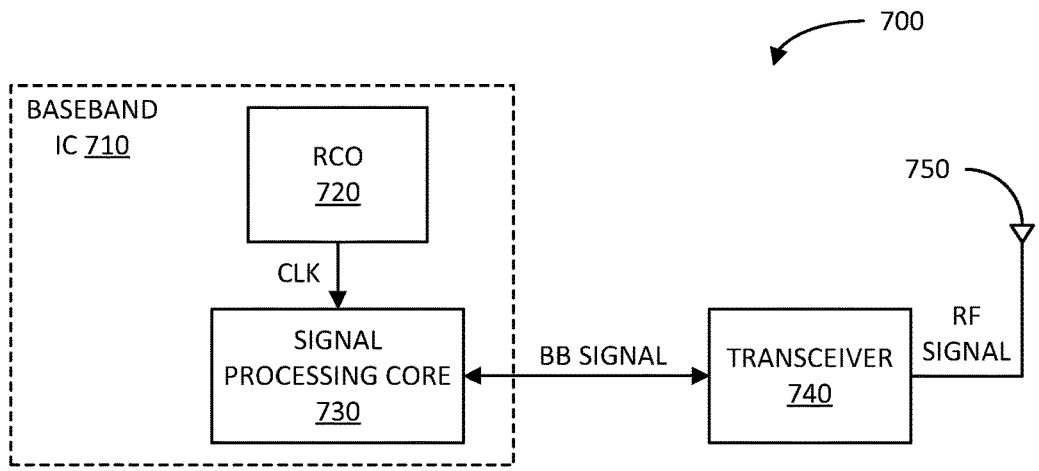
FIG. 7 illustrates a block diagram of an exemplary wireless communication device in accordance with another aspect of the disclosure.

FIG. 7 illustrates a block diagram of an exemplary wireless communication device 700 in accordance with another aspect of the disclosure. The wireless communication device 700 may be any type of wireless communication device, such as a smart phone, desktop computer, laptop computer, tablet devices, smart watches, Internet of Things (IoT), and others.

The wireless communication device 700 includes a baseband integrated circuit (IC) 710, a transceiver 740, and at least one antenna 750. The baseband IC 710, which may be configured as a system on chip (SoC), includes at least one resistor-capacitor oscillator (RCO) 720 and at least one signal processing core 730. The RCO 720 may be configured per any of the implementations described herein. The RCO 720 is configured to generate a clock (CLK). The signal processing core 730 is configured to process a baseband (BB) signal based on the clock generated by the RCO 720.

If the BB signal is to be transmitted to a remote wireless communication device, the signal processing core 730 sends the BB signal to the transceiver 740. The transceiver 740 processes the BB signal to generate a radio frequency (RF) signal. The RF signal is then provided to the at least one antenna 750 for wireless transmission to the remote wireless communication device.

If the BB signal derives from a remote wireless communication device, a corresponding RF signal from the remote wireless communication device is wirelessly received by the at least one antenna 750. The received RF signal is then provided to the transceiver 740, where it is processed to generate the BB signal. The BB signal is then provided to the signal processing core 730 for further processing based on the clock generated by the RCO 720.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
   a switched capacitor having
   a current source,
   a first switching device,
   a first capacitor coupled in series with the current source and the first switching device between a first voltage rail and a second voltage rail, and
   a second switching device coupled in parallel with the first capacitor;
   a low pass filter (LPF) including an input coupled to an output of the switched capacitor;
   a reference voltage generator;
   an integrator including a first input coupled to an output of the LPF and a second input coupled to an output of the reference voltage generator;
   a voltage controlled oscillator (VCO) including an input coupled to an output of the integrator;
   a first frequency divider including an input coupled to an output of the VCO; and
   a switched capacitor driver including an input coupled an output of the first frequency divider, wherein the switched capacitor includes an input coupled to an output of the switched capacitor driver.

2. The apparatus of claim 1, wherein the switched capacitor comprises a second capacitor coupled in parallel with the first switching device coupled in series the first capacitor.

3. The apparatus of claim 1, wherein the output of the switched capacitor driver is coupled to the first and second switching devices.

4. The apparatus of claim 1, wherein the reference voltage generator comprises a current source coupled in series with a resistor between a first voltage rail and a second voltage rail.

5. The apparatus of claim 1, wherein the LPF comprises:
a series resistor; and
a shunt capacitor.

6. The apparatus of claim 1, wherein the integrator comprises:
an operational amplifier, wherein a negative input of the operational amplifier includes the first input of the integrator, wherein a positive input of the operational amplifier includes the second input of the integrator, and wherein an output of the operational amplifier includes the output of the integrator; and
a capacitor coupled between the output and the negative input of the operational amplifier.

7. The apparatus of claim 6, wherein the integrator further comprises a resistor coupled in series with the capacitor between the output and the negative input of the operational amplifier.

8. The apparatus of claim 1, wherein the VCO comprises a ring oscillator (RO).

9. The apparatus of claim 1, wherein the first frequency divider comprises a fractional divider.

10. The apparatus of claim 1, wherein the first frequency divider comprises:
a multi-modulus divider, wherein a first input of the multi-modulus divider is the input of the first frequency divider, and an output of the multi-modulus divider is the output of the first frequency divider; and
a sequence generator including a first input coupled to the output of the multi-modulus divider, a second input to receive a frequency divider ratio control signal, and an output coupled a second input of the multi-modulus divider.

11. The apparatus of claim 10, wherein the sequence generator comprises a sigma-delta modulator.

12. The apparatus of claim 10, further comprises a frequency measurement circuit including a first input coupled to the output of the multi-modulus divider, a second input to receive a reference clock, and an output to generate the frequency divider ratio control signal.

13. The apparatus of claim 1, wherein the switched capacitor driver comprises a non-overlapping clock including first and second outputs, wherein the output of the switched capacitor driver comprises the first and second outputs to generate first and second non-overlapping clocks, and wherein the first and second outputs are coupled to the switched capacitor.

14. An apparatus, comprising:
a switched capacitor;
a low pass filter (LPF) including an input coupled to an output of the switched capacitor;
a reference voltage generator;
an integrator including a first input coupled to an output of the LPF and a second input coupled to an output of the reference voltage generator;
a voltage controlled oscillator (VCO) including an input coupled to an output of the integrator;
a first frequency divider including an input coupled to an output of the VCO,
a switched capacitor driver including an input coupled an output of the first frequency divider, wherein the switched capacitor includes an input coupled to an output of the switched capacitor driver; and
a switched capacitor sampler including a first input coupled to the output of the switched capacitor and an output coupled to the input of the LPF.

15. The apparatus of claim 14, wherein the switched capacitor sampler comprises:
a first switching device coupled between the first input of the switched capacitor sampler and an internal node;
a capacitor coupled between the internal node and a voltage rail; and
a second switching device coupled between the internal node and an output of the switched capacitor sampler.

16. The apparatus of claim 14, comprising a switched capacitor sampler driver including an input coupled to the output of the switched capacitor driver, and an output coupled to a second input of the switched capacitor sampler.

17. The apparatus of claim 16, wherein the switched capacitor sampler driver comprises:
a second frequency divider including an input coupled to the output of the switched capacitor driver; and
a non-overlapping clock including a first input coupled to an output of the second frequency divider, and first and second outputs to generate non-overlapping clocks for first and second switching devices in the switched capacitor sampler.

18. The apparatus of claim 17, wherein the non-overlapping clock is configured to assert signals at the first and second outputs in response to a start signal.

19. An apparatus, comprising:
a switched capacitor configured to generate a sawtooth or ramp voltage in response to a switched capacitor drive signal;
a low pass filter (LPF) configured to filter the sawtooth or ramp voltage to generate a filtered voltage;
a reference voltage generator configured to generate a reference voltage;
an integrator configured to integrate a difference between the sawtooth or ramp voltage and the reference voltage to generate a frequency control signal;
a voltage controlled oscillator (VCO) configured to generate a first clock based on the frequency control signal;
a frequency divider configured to frequency divide the first clock to generate a second clock; and
a switched capacitor driver configured to generate the switched capacitor drive signal in response to the second clock.

20. The apparatus of claim 19, comprising a switched capacitor sampler configured to generate a sampled voltage of the sawtooth or ramp voltage, wherein the LPF is configured to filter the sampled voltage to generate the filtered voltage.

21. The apparatus of claim 20, wherein the switched capacitor sampler comprises:
a sampling capacitor to store the sampled voltage;
a first switching device configured to:
route the sawtooth or ramp voltage to the sampling capacitor to generate the sampled voltage during a first time interval; and
decouple the sawtooth or ramp voltage from the sampling capacitor during a second time interval; and
a second switching device configured to:
decouple the LPF from the sampling capacitor during the first time interval; and
provide the sampled voltage to the LPF during the second time interval.

22. The apparatus of claim 21, wherein the first and second time intervals are based on periods of the second clock, respectively.

23. The apparatus of claim 21, wherein the first and second time intervals are based on a defined number of periods of the second clock, respectively.

24. The apparatus of claim 21, wherein the first and second switching devices are further configured to provide the sawtooth or ramp voltage to the LPF during a third time interval.

25. A method, comprising:
- generating a sawtooth or ramp voltage in response to a switched capacitor drive signal;
- filtering the sawtooth or ramp voltage to generate a filtered voltage;
- generating a reference voltage;
- integrating a difference between the sawtooth or ramp voltage and the reference voltage to generate a frequency control signal;
- generating a first clock based on the frequency control signal;
- frequency dividing the first clock to generate a second clock; and
- generating the switched capacitor drive signal based on the second clock.

26. The method of claim 25, comprising sampling the sawtooth or ramp voltage to generate a sampled voltage, wherein filtering the sawtooth or ramp voltage comprises filtering the sampled voltage.

27. The method of claim 26, wherein sampling the sawtooth or ramp voltage to generate the sampled voltage comprises:

integrating the sawtooth or ramp voltage using a sampling capacitor to generate the sampled voltage, while decoupling the sampling capacitor from a resistor-capacitor (RC) filter during a first time interval; and applying the sampled voltage to the RC filter while decoupling the sampling capacitor from the sawtooth or ramp voltage during a second time interval.

28. A wireless communication device, comprising:
an oscillator, comprising:
- a switched capacitor,
- a low pass filter (LPF) including an input coupled to an output of the switched capacitor,
- a reference voltage generator,
- an integrator including a first input coupled to an output of the LPF and a second input coupled to an output of the reference voltage generator,
- a voltage controlled oscillator (VCO) including an input coupled to an output of the integrator,
- a frequency divider including an input coupled to an output of the VCO,
- a switched capacitor driver including an input coupled an output of the frequency divider, wherein the switched capacitor includes an input coupled to an output of the switched capacitor driver, and
- a switched capacitor sampler including a first input coupled to the output of the switched capacitor and an output coupled to the input of the LPF;

a signal processing core coupled to the oscillator;
a transceiver coupled to the signal processing core; and
at least one antenna coupled to the transceiver.

* * * * *